A composite laminate, including shrink-prevention ceramic green sheets arranged on the main surfaces of an unfired ceramic laminate and having a sintering temperature greater than the firing temperature of the unfired ceramic laminate, is fired at a temperature which is greater than the sintering temperature of the unfired ceramic laminate, and which is less than the sintering temperature of the shrink-prevention ceramic green sheet. Thereafter, the shrink-prevention ceramic green sheets are removed in a first removing step of spraying water and compressed gas against the shrink-prevention ceramic green sheets so as to remove a portion thereof that has not reacted with a glass component of the unfired ceramic laminate, and in a second removing step of ceramic powder, spraying water, and compressed air, such that a residual material not removed in the first removing step is removed, and in a third removing step of supersonic-cleaning the ceramic multi-layer substrate after the first and second steps.

United States Patent

Saito

(10) Patent No.: US 7,148,136 B2
(45) Date of Patent: Dec. 12, 2006

(54) METHOD OF PRODUCING CERAMIC MULTI-LAYER SUBSTRATE

(75) Inventor: Yoshifumi Saito, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/530,374

(22) PCT Filed: Aug. 22, 2003

(86) PCT No.: PCT/JP03/10609

§ 371 (c)(1),
(2), (4) Date: Apr. 6, 2005

(87) PCT Pub. No.: WO2004/034758

PCT Pub. Date: Apr. 22, 2004

(65) Prior Publication Data

US 2005/0269012 A1    Dec. 8, 2005

(30) Foreign Application Priority Data

Oct. 10, 2002    (JP) .............................. 2002-297837

(51) Int. Cl.
*H01L 21/4763* (2006.01)
(52) U.S. Cl. .................... 438/618; 438/761; 156/89.11; 257/E23.009; 257/E23.106
(58) Field of Classification Search ................. 438/761, 438/618; 427/126.2, 255.11, 269; 156/89.11; 257/E23.009, E23.106
See application file for complete search history.

(56) References Cited

U.S. PATENT DOCUMENTS 6,740,183 B1 *  5/2004  Segawa et al. .......... 156/89.11

FOREIGN PATENT DOCUMENTS

| EP | 0 993 242 A1 | 4/2000 |
| JP | 04-243978 | 9/1992 |
| JP | 2000-277914 A | 10/2000 |
| WO | WO99/56510 | 11/1999 |

* cited by examiner

*Primary Examiner*—Michelle Estrada
(74) *Attorney, Agent, or Firm*—Keating & Bennett, LLP

(57) ABSTRACT

19 Claims, 5 Drawing Sheets

METHOD OF PRODUCING CERAMIC MULTI-LAYER SUBSTRATE

BACKGROUND OF THE INVENTION

1. Field of the Invention

The present invention relates to a method of producing a ceramic multi-layer substrate on which semiconductor devices, chip capacitors, and other suitable components are to be mounted.

2. Description of the Related Art

In the production of ceramic multi-layer substrates on which semiconductor devices, chip capacitors, and other suitable components are to be mounted, ceramic green sheets are laminated to each other to form an unfired ceramic laminate, and then, the laminate is fired. However, when the unfired laminate is fired, the unfired ceramic laminate shrinks during firing, such that dimensional errors are caused.

Thus, for example, as described in Japanese Unexamined Patent Application Publication No. 4-243978, shrink-prevention ceramic green sheets, which are not sintered at the firing temperature of the unfired ceramic laminate, are arranged on both of the main surfaces of the unfired ceramic laminate, and the unfired ceramic laminate is fired at a temperature which is higher than the sintering temperature of the unfired ceramic laminate and which is lower than the sintering temperature of the shrink-prevention ceramic green sheets, and thereafter, the shrink-prevention green sheets are removed.

The specific method of removing shrink-prevention ceramic green sheets described in WO99/56510 is known, in which as a first method, spraying ceramic powder together with compressed air, as a second method, spraying water together with compressed air, and as a third method, spraying a mixture of ceramic power with water together with compressed air are described.

However, when the first, second, and third methods are individually used, the following problems occur.

That is, according to the first method, the removing capacity is low, since the spraying area of the ceramic powder is small. Also, the positional accuracy in the processing range is low. Thus, the processing may become unstable. As a result, it is difficult to uniformly remove the shrink-prevention ceramic green sheets. Moreover, a large-scale apparatus is required to collect the sprayed ceramic powder and the powder of the removed ceramic green sheets. Thus, expensive large-scale facilities are required.

According to the second method, a larger portion of the shrink-prevention ceramic green sheets can be removed. However, in the following situations, the shrink-prevention ceramic green sheets can not be removed. That is, if glass is included in the unfired ceramic laminate, the glass component of the unfired ceramic laminate and the ceramic component of the shrink-prevention ceramic green sheets will bond to each other to form a reaction layer. This reaction layer cannot be sufficiently removed simply by spraying water together with compressed air.

According to the third method, the shrink-prevention green sheets can be removed more uniformly as compared to the method of spraying ceramic powder together with compressed air. The removal-capacity is increased as compared to the method of spraying water with compressed air. However, according to this method, to allow re-use of the spraying ceramic powder, the ceramic powder to be sprayed must have an average particle size substantially equal to that of the ceramic powder of the shrink-prevention ceramic green sheets. If the particle size of the spraying ceramic powder is larger than that of the ceramic powder of the shrink-prevention ceramic green sheets, it will be difficult to remove the powder of the shrink-prevention ceramic sheets using a filter, and thus, the average particle size of the spraying ceramic powder changes as the time that the spraying ceramic powder is used increases. As a result, the removing conditions for the shrink-prevention ceramic sheets change, and thus, it is difficult to uniformly perform the processing. On the other hand, if the average particle size of the spraying ceramic powder is smaller than that of the shrink-prevention ceramic sheets, the shrink-prevention ceramic sheets can be removed using a filter. However, in the case in which the average particle sizes of the used ceramic powders are not significantly different from each other, a portion of the spraying ceramic powder will also be removed by the filter. Thus, the average particle size of the spraying ceramic powder changes as the time that the spraying ceramic powder is used increases. As a result, the removing conditions for the shrink-prevention ceramic sheets change. Thus, it is difficult to uniformly perform the processing.

SUMMARY OF THE INVENTION

To overcome the problems described above, preferred embodiments of the present invention provide a method of uniformly removing a shrink-prevention ceramic sheet in the production of a ceramic multi-layer substrate using the shrink-prevention ceramic sheet.

According to a preferred embodiment of the present invention, a method of producing a ceramic multi-layer substrate includes a step of preparing a composite laminate including an unfired ceramic laminate formed by laminating a plurality of substrate ceramic green sheets, and a shrink-prevention ceramic green sheet arranged on at least one of the main surfaces of the unfired ceramic laminate and being substantially incapable of being sintered at the firing temperature of the unfired ceramic laminate, a step of firing the composite laminate at a temperature at which the unfired ceramic laminate can be fired and which is lower than the sintering temperature of the shrink-prevention ceramic green sheet, and a step of removing the shrink-prevention ceramic green sheet subjected to the firing step, from the fired composite laminate, wherein the step of removing the shrink-prevention ceramic green sheet includes a first removing step of spraying a liquid material (particularly, water) and compressed gas (particularly, compressed air) against the shrink-prevention ceramic green sheet on the main surface of the composite laminate subjected to the firing step, and a second removing step of spraying ceramic powder, a liquid material (particularly, water), and compressed gas (particularly, compressed air) against the main surface of the ceramic multilayer substrate subjected to the first removing step.

Preferably, the method of producing a ceramic multi-layer substrate according to this preferred embodiment of the present invention further includes a step of supersonic-cleaning the ceramic multilayer substrate as a third removing step after the first and second steps. Also, preferably, the method of producing a ceramic multi-layer substrate according to this preferred embodiment of the present invention further includes a step of spraying a liquid material (particularly, water) and compressed gas (particularly, air) against the main surface of the ceramic multi-layer substrate as a third removing step after the first and second removing steps.

According to the method of producing a ceramic multi-layer substrate of this preferred embodiment of the present invention, primarily a portion of the shrink-prevention ceramic green sheet, which does not react with a glass component of the ceramic multi-layer substrate, is removed in the first removing step of spraying a liquid material and compressed gas. Thereafter, a residual material which is not removed in the first removing step is removed in the second removing step. Moreover, in the third removing step of supersonic-cleaning or spraying a liquid material and compressed gas, a residual material not removed in the second removing step and the ceramic powder sprayed in the second removing step are removed. Thereby, the shrink-prevention ceramic green sheet is uniformly removed.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Hereinafter, the present invention will be described with reference to preferred embodiments.

First Preferred Embodiment

1. Process of Preparing Composite Laminate and Firing the Same

Figure 1:
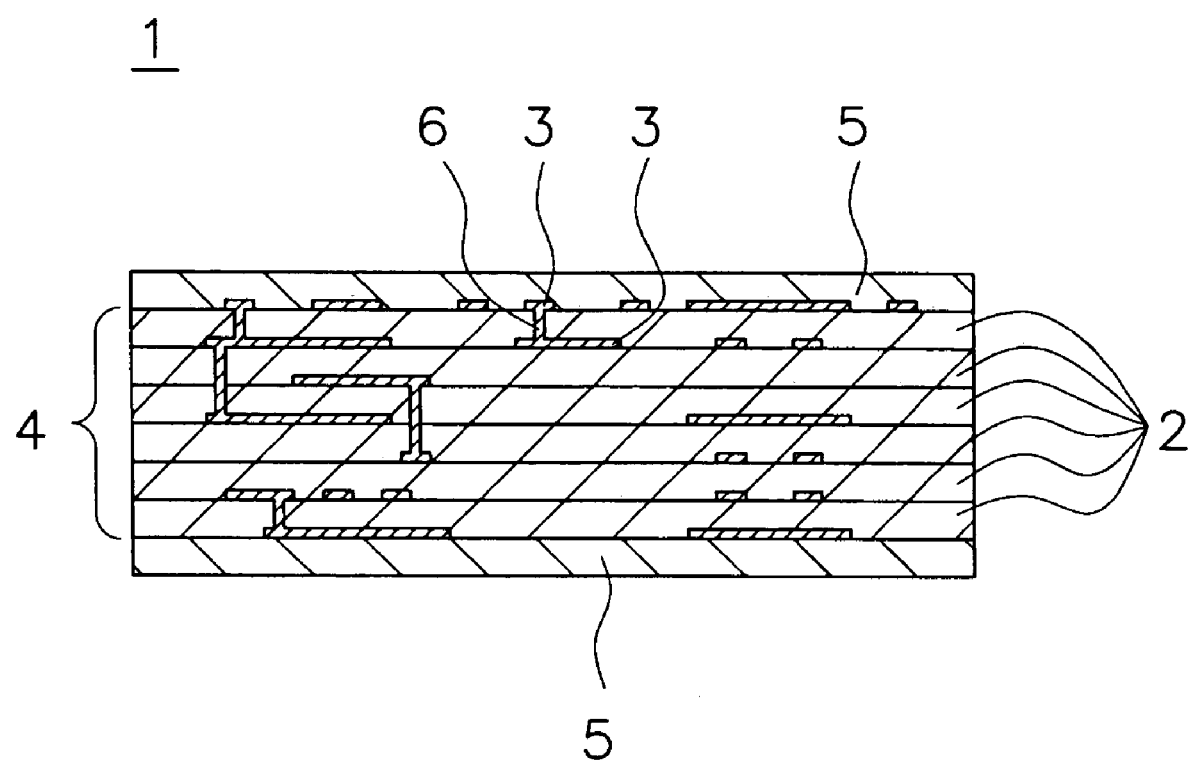
FIG. 1 is a schematic cross-sectional view of a ceramic multi-layer substrate according to a preferred embodiment of the present invention.

As shown in FIG. 1, a composite laminate 1 is prepared by laminating a plurality of ceramic green sheets 2 for substrate conductive layers 3 to form an unfired ceramic laminate 4, and laminating and press-bonding shrink-prevention ceramic sheets 5 to both of the main surfaces of the unfired ceramic laminate 4. In the composite laminate 1, via-conductors 6 are formed so as to connect the conductive layers 3 provided at different heights. It is to be noted than the shrink-prevention ceramic sheets 5 may be provided on one of the main surfaces thereof.

The substrate ceramic green sheets 2 may be prepared, e.g., by adding a binder, a plasticizer, and a solvent to ceramic powder, mixing them using a ball mill, an atractor, or other suitable device to form a slurry, and forming the slurry into a sheet having a thickness of about 25 µm to about 200 µm by a doctor blade method or other suitable method.

As a ceramic powder used to form a substrate ceramic green sheet, so-called LTCC (Low Temperature Co-Fired Ceramic) powder may be used. For example, crystallized glass having a crystallized temperature of about 600° C. to about 1,000° C. may be used, or the crystallized glass having a ceramic filler, such as alumina, zirconia, mullite, cordierite, anosite, silica, or other suitable ceramic filler, added thereto may be used. Moreover, as a binder, for example, polyvinylbutyral, a methacrylic polymer, an acrylic polymer, or other suitable binder may be used. As a plasticizer, derivatives of phthalic acid or other suitable plasticizer may be used. As a plasticizer, alcohols, ketones, chlorine type organic solvents, or other plasticizers may also be used.

The conductive layer 3 includes a surface conductor layer and an internal conductor layer. The conductor layer 3 is formed by printing conductor paste containing metal powder of Ag, Cu, or other suitable metal powder onto the substrate ceramic green sheet 2. Moreover, the via-conductor 6 provided for the composite laminate 1 is formed by filling the conductor paste into a via-hole formed in the substrate ceramic green sheets 2.

The shrink-prevention ceramic green sheet 5 is prepared using the same method as that for the substrate ceramic green sheet 2. However, the sintering temperature is higher than the temperature of the substrate ceramic green sheets 2. For example, where ceramic powder having a sintering temperature of up to about 1,100° C. is used for the substrate ceramic green sheets 2, alumina, zirconium oxide, aluminum nitride, boron nitride, mullite, magnesium oxide, silicon carbide, or other suitable material may be used. The average particle sizes of these ceramic powders are in the range of about 0.5 µm to about 4 µm. If the particle size is too large, the shrink-controlling force for the substrate ceramic sheets is reduced. Moreover, the surface of the formed ceramic multi-layer substrate is rough in some instances.

In press-bonding the substrate ceramic green sheets 5 to both of the main surfaces of the unfired ceramic laminate 4, the pressure applied for the press-bonding is preferably in the range of about 10 MPa to about 200 MPa, and the temperature is preferably in the range of about 40° C. to about 90° C.

Thereafter, the composite laminate 1 is fired. Thus, the ceramic multi-layer substrate having the shrink-prevention ceramic green sheets 5 formed on both of the main surfaces is prepared. The sintering temperature must be a temperature at which the unfired ceramic laminate 4, that is, the substrate ceramic green sheets are sintered and which is less than the sintering temperature of the shrink-prevention ceramic green sheets 5. That is, the shrink-prevention ceramic green sheets are not sintered when fired. Since the shrink-prevention ceramic green sheets are not shrunk during firing, the shrink of the ceramic laminate in the plane direction is suppressed. This is because the glass component which oozes out from the ceramic laminate at firing and the shrink-prevention ceramic green sheets react with each other, and thus, the reaction layer is formed at the interface. Accordingly, the positional accuracy of the conductor patterns provided on the ceramic laminate is maintained when it is subjected to the firing process, and the disconnection thereof is prevented.

2. First Removing Step

After the composite laminate is fired, a liquid material, together with compressed air, is sprayed against the shrink-prevention ceramic green sheets. At this time, the organic component, such as a binder, has been fired out and removed from the shrink-prevention ceramic green sheets. Thus, the green sheets are in the porous state. As a liquid material, an acidic aqueous solution, an alkali solution, an organic solvent, or other suitable liquid material may be used. Particularly, water is preferable from the viewpoint of the property with respect to the environments and the cost-performance.

Moreover, as compressed gas, nitrogen gas or other suitable gas may be used. Particularly, compressed air is preferable from the viewpoint of the cost-performance.

Figure 2:
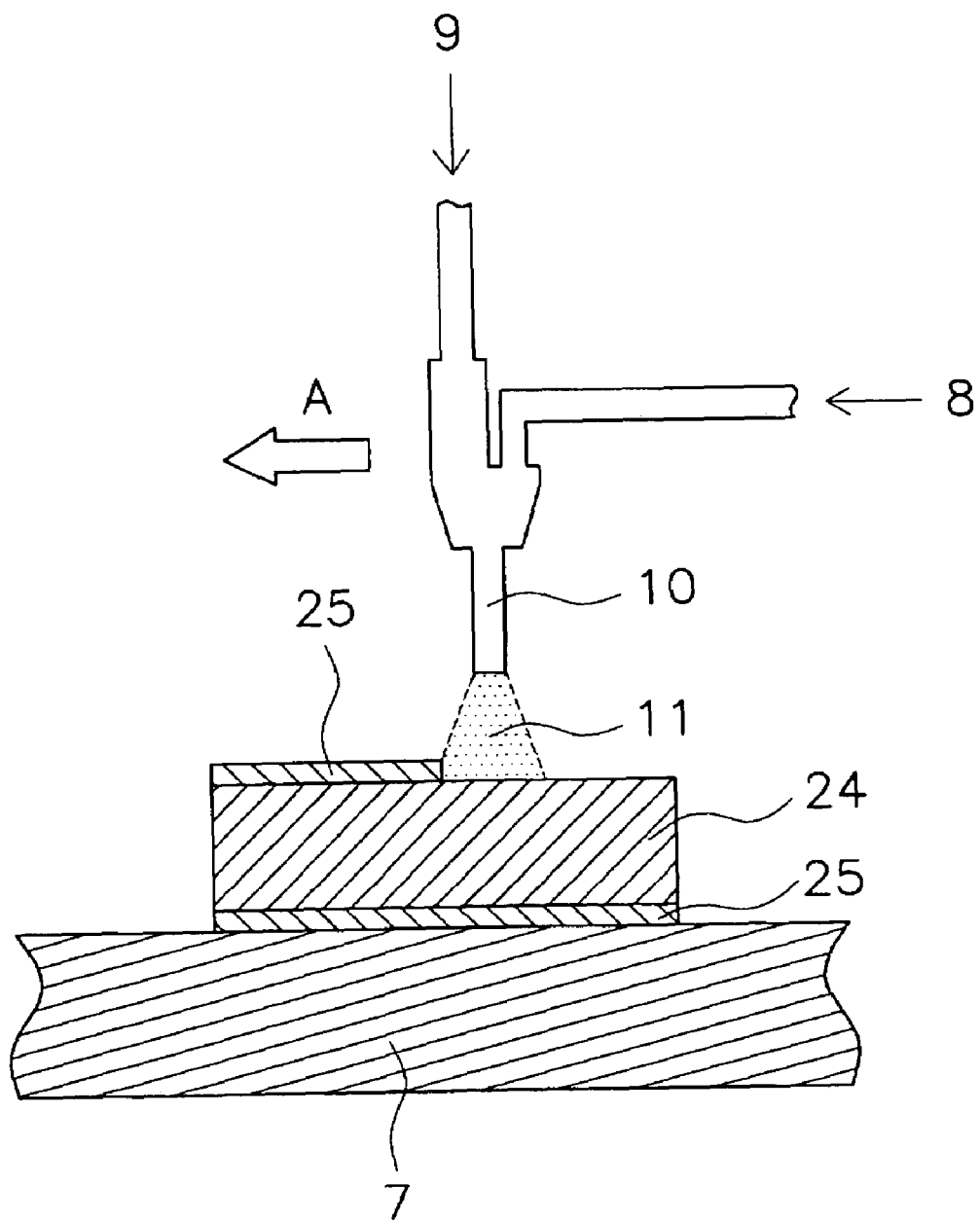
FIG. 2 schematically shows a step in a method of producing a ceramic multi-layer substrate according to the preferred embodiment of the present invention.

As a method of spraying a liquid material together with compressed gas, a method using a plasto-nozzle as shown in FIG. 2 is used as an example. In particular, a ceramic multi-layer substrate 24, which has been subjected to a firing process, is placed on a stand 7. Thereafter, a sealed material (here, water) is sprayed against a shrink-prevention ceramic green sheet 25 formed on one of the main surfaces of the ceramic multi-layer substrate 24, while the sealed material 8 is accelerated with compressed gas 9. A mixture 11 of the water 8 and the compressed gas 9 is discharged through a nozzle 10, which is a discharge port of the plasto-nozzle. Then, the mixture 11 is continuously sprayed while the nozzle 10 is sequentially scanned in a direction A shown by the arrow in FIG. 2.

The pressure of the compressed gas is preferably in the range of about 147 kPa to about 539 kPa. If the processing is performed at a pressure of less than about 147 kPa, the removing capacity for the shrink-prevention ceramic green sheet is inferior, since the spraying pressure is excessively low, and the production efficiency decreases. On the other hand, if the processing is performed at a pressure of more than about 539 kPa, the degradation of the nozzle 10 is accelerated due to the pressure. Moreover, the consumption of the compressed gas 9 increases, which causes increased running cost and also may damage the ceramic multi-layer substrate 24. Here, the pressure of compresses gas means a pressure thereof in the piping before being sprayed.

By carrying out the first removing step, a portion of the shrink-prevention ceramic green sheet 25 which has not reacted with a glass component of the ceramic multi-layer substrate 24 is removed. As a result, the reaction layer formed by the reaction of the shrink-prevention ceramic green sheet 25 with the glass component of the ceramic multi-layer substrate 24 remains. Also, in some cases, the non-reacted portion of the shrink-prevention ceramic green sheet 25, which does not react with the glass component of the ceramic multi-layer substrate 24, is not removed by the first removing step. FIG. 2 shows a state in which the shrink-prevention ceramic green sheet 25 is partially removed, while no residual material of the shrink-prevention ceramic green sheet 25 is shown in the drawing.

Powder recovered in the first removing step essentially consists of the ceramic powder generated from the shrink-prevention ceramic green sheet. Therefore, the powder can be efficiently recovered and re-used as ceramic powder particularly for use in a shrink-prevention ceramic green sheet.

3. Second Removing Step

Thereafter, ceramic powder and a liquid material are sprayed, together with compressed gas, against both of the main surfaces of the ceramic multi-layer substrate which have been subjected to the first removing step. In this method, for example, they are sprayed, using a plasto-nozzle in a manner similar to that described with respect to the first removing step. In FIG. 2, as a sealed material 8, a mixture of ceramic powder and water is injected. The ceramic powder, water, and compressed gas are discharged through the nozzle 10. Here, as a liquid material, an acidic aqueous solution, an alkali aqueous solution, an organic solvent, or other suitable liquid materials may be also used. From the viewpoints of the property with respect to the environments and the cost-performance, water is preferable. As compressed gas, nitrogen gas may be used. From the viewpoint of the cost-performance, compressed air is preferable.

The pressure of the compressed gas is preferably in the range of about 98 kPa to about 343 kPa. If the processing is performed at a pressure of less than about 98 kPa, the removing capacity for the shrink-prevention ceramic green sheets is inferior, since the spraying pressure is excessively low, and the production efficiency decreases. If the processing is performed at a pressure of more than about 343 kPa, cracks are likely to occur at the interfaces between the surface conductor layers and the ceramic multi-layer substrate. Thus, the bonding strength between the conductor layers and the composite laminate is reduced. Therefore, peeling of the conductor layers in the plating step is likely to occur. In this case, the pressure is preferably smaller than that in the first removing step. That is, in the second removing step, the ceramic power is used as abrasive grains. Thus, if the pressure of the compressed air is higher than that in the first removing step, the surface property of the ceramic multi-layer substrate, particularly, the surface properties of the conductor layers of the ceramic multi-layer substrate will be deteriorated.

Preferably, the average particle size of the ceramic powder for spraying is in the range in the range of about 9.5 µm to about 40 µm. If ceramic powder having an average particle size of less than about 9.5 µm is used, the removing capacity for the shrink-prevention ceramic green sheets is inferior, and the production efficiency is reduced. On the other hand, if ceramic powder having an average particle size of more than about 40 µm is used, the collision force is increased during spraying, such that cracks are likely to occur at the interfaces between the conductor layers and the composite laminate. Thus, the bonding strength is reduced, and the conductor layers are likely to peel in the plating step. Moreover, problems occur in that the processing of portions at which the intervals between wirings are small is likely to be irregular, since the particle size is large.

When the second removing step is performed, most of the trace amount of residual materials on both of the surfaces of the ceramic multi-layer substrate, which have not been removed in the first removing step, are removed, due to the physical action of the liquid material (particularly, water), the ceramic powder, and the compressed gas (particularly, compressed air). The ceramic powder recovered in the second removing step essentially consists of the ceramic powder sprayed together with water. Therefore, the ceramic powder can be efficiently recovered and re-used as ceramic powder to be sprayed.

4. Third Removing Step

Thereafter, the ceramic multi-layer substrate which has been subjected to the first and second removing steps is cleaned by a supersonic wave method.

Figure 3:
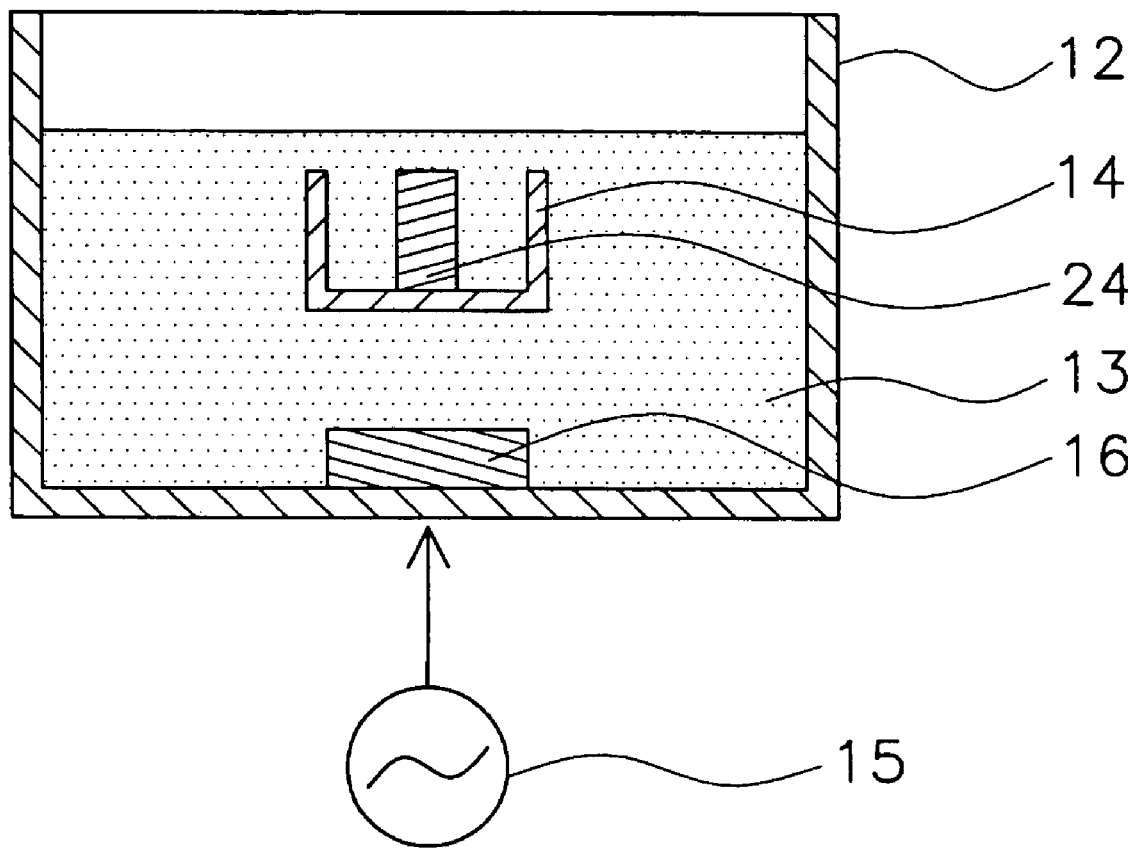
FIG. 3 schematically shows a step in a method of producing a ceramic multi-layer substrate according to the preferred embodiment of the present invention.

In this step, as shown in FIG. 3, a cleaning liquid 13 is placed in a cleaning tank 12. The ceramic multi-layer substrate 24 is placed into a cleaning basket 14 disposed in the cleaning tank 12. Thus, supersonic waves are irradiated into the cleaning liquid 13 by a supersonic wave vibrator 16. Examples of the cleaning liquid include a methylene chloride aqueous solution, a trichloroethylene aqueous solution, and other suitable cleaning liquids.

It is preferable that the ceramic multi-layer substrate 24 is set in the cleaning basket 14 so as to stand upright. In this step, residual materials which have not been removed in the first and second removing steps, and the ceramic powder sprayed in the second removing step which remains on the surface are removed.

Preferably, the vibrator frequency used in the supersonic cleaning is in the range of about 40 kHz to about 100 kHz. If the processing is performed at about 40 KHz or less, the cavitation force increases, such that the substrate swings considerably during the processing. Where a substrate has a small thickness, the substrate may crack. Conductor layers located in the vicinity of the vibrating portion of the vibrator may be broken. Moreover, when the cavitation force is high, the removing capacity for the ceramic powder placed into the porous portions of the ceramic layer and the conductor layers is low. This will cause problems such as irregular plating and abnormal deposition. If the processing is carried out at about 100 KHz or higher, the cavitation force is extremely low, and the removing effect on the ceramic powder (sprayed ceramic powder) remaining on the surface of the ceramic multi-layer substrate is reduced. This results in low production efficiency.

Preferably, the output per unit area of the supersonic vibrator is in the range of about 0.2 W/cm$^2$ to about 2.0 W/cm$^2$. If the processing is performed at less than about 0.2 W/cm$^2$, the removing effect on the ceramic powder (sprayed ceramic powder) remaining on the surface of the ceramic multi-layer substrate decreases, and the production efficiency is reduced. On the other hand, if the processing is carried out at about 2.0 W/cm$^2$ or higher, the substrate swings considerably during the processing. Where a substrate has a small thickness, the substrate may be broken. Conductor layers located in the vicinity of the vibrating portion of the vibrator may be significantly damaged and broken. Moreover, the removing capacity for the ceramic powder placed into the porous portions of the ceramic layer and the conductor layers is low. This will cause problems such as irregular plating and abnormal deposition.

When the supersonic cleaning is performed, residual materials which have not been removed in the second removing step, and the ceramic powder which has been sprayed in the second removing step, are removed from the main surfaces of the ceramic multi-layer substrate 24, by the physical action of the cavitation and the chemical action of a cleaning agent.

Second Preferred Embodiment

Similar to the above-described first preferred embodiment, the composite laminate having the shrink-prevention ceramic green sheets formed on both of the main surfaces is prepared, and is subjected to the first and second removing steps.

5. Third Removing Step

A liquid material is sprayed, together with compressed gas, against the ceramic multi-layer substrate which has been subjected to the first and second removing steps. In this case, e.g., the method using a plasto-nozzle similar to the first removing step according to the first preferred embodiment may be used. Here, as a liquid material, an acidic aqueous solution, an alkali aqueous solution, an organic solvent, and other suitable liquid materials may be used. From the viewpoints of environmental characteristics and the cost performance, water is preferable. As compressed gas, nitrogen gas may be used. From the viewpoint of the cost performance, compressed air is preferable.

The pressure of the compressed gas is preferably in the range of about 147 kPa to about 539 kPa. If the processing is performed at a pressure of less than about 147 kPa, the removing capacity for the shrink-prevention ceramic green sheets is inferior, since the spraying pressure is excessively low, and the production efficiency decreases. On the other hand, if the processing is carried out at a pressure of more than about 539 kPa, the degradation of the nozzle 10 is accelerated due to the pressure. Moreover, the consumption of the compressed gas 9 increases, such that the running cost increases, and the ceramic multi-layer substrate 24 may be damaged. It is preferable that the pressure is greater than that in the second removing step. Thus, if the pressure of the compressed air is less than that in the second removing step, it will be difficult to remove the ceramic powder (sprayed ceramic powder) intruding into the surface of the ceramic multi-layer substrate in the second removing step.

EXAMPLE

Hereinafter, the present invention will be described with reference to specific examples.

Example 1

First, 15 parts by weight of polyvinylbutyral, 40 parts by weight of isopropylalcohol, and 20 parts by weight of trol were added to 100 parts by weight of mixed powder formed by mixing crystallized glass powder containing $SiO_2$, $Al_2O_3$, $B_2O_3$, and CaO with alumina powder at an equi-percents by weight, and mixed with a ball mill for about 24 hours to form a slurry. The slurry was formed into a ceramic sheet with a thickness of about 120 μm. Thus, a ceramic green sheet for a substrate was formed.

Figure 4:
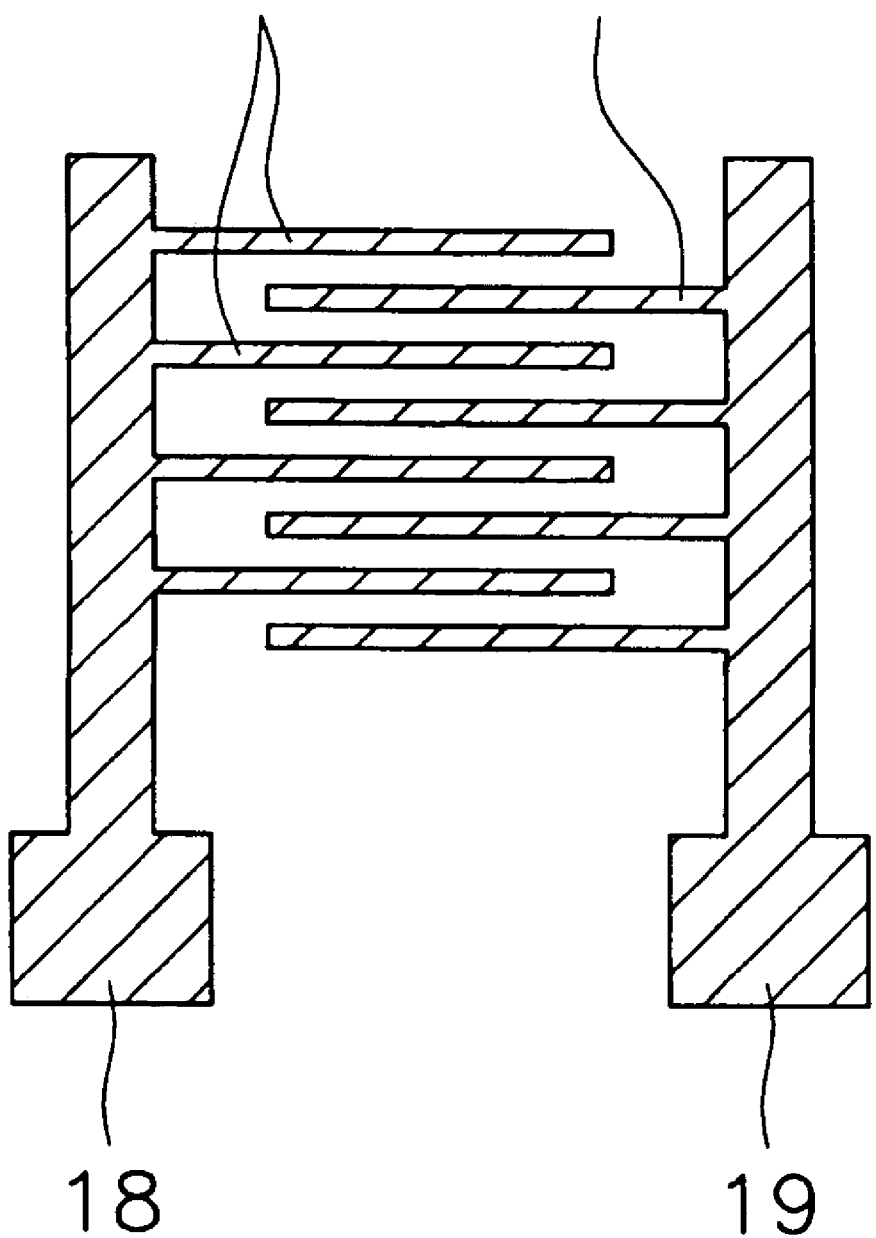
FIG. 4 is a schematic cross-sectional view of an inter-digital electrode on the ceramic multi-layer substrate according to a preferred embodiment of the present invention.

Subsequently, Ag paste was screen-printed thereon in a predetermined location. The ceramic green sheets for a substrate were coated as described above, and an interdigital electrode was formed. As shown in FIG. 4, an interdigital electrode 17 includes first electrode fingers 18a disposed on a first terminal 18, and second electrode fingers 19a on a second terminal 19 which are arranged in opposition to each other on the substrate ceramic green sheet 2. The widths of the first electrode fingers 18a and the second electrode fingers 19a are preferably about 100 μm, and the intervals between the first electrode fingers 18a and the second electrode fingers 19a are about 100 μm.

Then, 15 parts by weight of polyvinylbutyral, 40 parts by weight of isopropylalcohol, and 20 parts by weight of trol were added to 100 parts by weight of alumina powder, and mixed with a ball mill for 24 hours to form a slurry. The slurry was formed into a ceramic sheet with a thickness of about 120 μm by a doctor blade method. Thus, a shrink-prevention ceramic green sheet was formed.

Then, six substrate ceramic green sheets were laminated, and also, the shrink-prevention ceramic green sheets were laminated to both of the main surfaces of the six substrate ceramic green sheets, respectively. Then, the sheets were press-bonded at a pressure of about 150 MPa and a temperature of about 60° C. Thus, a composite laminate was formed.

Thereafter, the composite laminate was placed on a tray made of an alumina plate with a flatness degree of up to about 0.05% and a porosity of about 70%, and heated at about 600° C. for about 3 hours, and thereafter, pressed at a temperature of about 900° C. for about 1 hour. Thus, the substrate ceramic green sheets were sintered.

Subsequently, in the first removing step, water together with compressed air having the respective pressures in the range of about 147 kPa to about 539 kPa shown in Table 1, was sprayed for about 120 seconds against the shrink-prevention ceramic green sheets provided on both of the main surfaces of the ceramic multi-layer substrate.

Thereafter, in the second removing step, water and alumina powders with the respective average particle sizes in the range of about 9.5 µm to about 40 µm shown in Table 1, together with compressed air in the range of about 98 kPa to about 343 kPa were sprayed for about 120 seconds against residual materials on the ceramic multi-layer substrate after the first removing step.

Subsequently, in the third removing step, supersonic cleaning was carried out at a supersonic vibrator frequency of about 40 kHz to about 100 kHz and an output per unit supersonic vibrator of about 0.2 W/cm² to about 2.0 W/cm² for about 300 seconds.

As a result of the above-described steps, the ceramic multi-layer substrates of Samples 1 to 8 were formed.

Comparative Example 1

A composite laminate was formed and fired under the same preparation conditions as those in First Example. The shrink-prevention ceramic green sheets were removed from the composite laminate, not subjected to the second removing step. In particular, in the first removing step, water and compressed air with about 539 kPa were sprayed for about 120 seconds against the shrink-prevention ceramic green sheets provided on both of the main surfaces of the ceramic multi-layer substrate. Thereafter, in the third removing step, supersonic cleaning was carried out at a supersonic vibrator frequency of about 40 kHz, an output per unit area of a supersonic vibrator of about 0.2/cm² for about 300 seconds.

As a result of the above-described steps, the ceramic multi-layer substrate of First Comparative Example was produced.

Second Comparative Example 2

A composite laminate was formed and fired in the same conditions as those in Example 1. Twenty samples were prepared. These twenty samples were subjected to the second and third removing steps were to remove the shrink-prevention ceramic green sheets, but not the first removing step. In the second removing step, water and alumina powder with an average particle size of about 9.5 µm, together with compressed air with about 98 kPa, were sprayed for about 120 seconds against both of the main surfaces of the ceramic multi-layer substrate. Thereafter, in the third removing step, the twenty substrates were super-sonic-cleaned at a supersonic vibrator frequency of about 40 kHz and an output per unit area of a supersonic vibrator of about 0.2/cm² for about 300 seconds. For the twenty samples, the second and third removing steps were performed sequentially, one by one from the first sample to the twentieth sample. After these steps, a ceramic multi-layer substrate of comparative example 2a (first sample) and a ceramic multi-layer substrate of comparative example 2b (second sample) were prepared.

Regarding the respective samples (samples Nos. 1 to 8, comparative example 1, and comparative examples 2a and 2b) prepared in EXAMPLE 1, COMPARATIVE EXAMPLE 1, and COMPARATIVE EXAMPLE 2, the appearances were examined, and the results were shown in Table 1, where a circular mark represents "no irregular-removal", and a cross mark does "irregular removal".

Thereafter, a palladium catalyst was applied to the respective samples of the ceramic multi-layer substrates, and then, the cleaning was performed, such that nuclei of the palladium catalyst were formed on the interdigital electrode portion. Thereafter, electroless nickel plating was performed. Thus, nickel plating was performed on the interdigital electrode portion. A voltage of about 50 V was applied to the interdigital electrode portion under the conditions of about 85° C. and about 85% RH for about 1,000 hours. Then, the insulation resistance was measured. Table 1 shows the measuring results.

TABLE 1

| | First removing step | Second removing step | | Third removing step | | Appearance | Insulation resistance |
|---|---|---|---|---|---|---|---|
| | | Average particle | | | | | |
| Sample Number | Pressure (kPa) | size (µm) | Pressure (kPA) | Frequency (KHz) | Output (W/cm²) | of substrate | LogIR (Ω) |
| No. 1 | 147 | 9.5 | 98 | 40 | 0.2 | ○ | ≧9 |
| No. 2 | 539 | 9.5 | 98 | 40 | 0.2 | ○ | ≧9 |
| No. 3 | 147 | 9.5 | 343 | 40 | 0.2 | ○ | ≧9 |
| No. 4 | 147 | 40 | 98 | 40 | 0.2 | ○ | ≧9 |
| No. 5 | 147 | 40 | 343 | 40 | 0.2 | ○ | ≧9 |
| No. 6 | 147 | 9.5 | 98 | 40 | 2.0 | ○ | ≧9 |
| No. 7 | 147 | 9.5 | 98 | 100 | 0.2 | ○ | ≧9 |
| No. 8 | 147 | 9.5 | 98 | 100 | 1.0 | ○ | ≧9 |
| Comparative example 1 | 539 | Not processed | | 40 | 0.2 | x | ≦5 |
| Comparative example 2a | Not processed (first sample) | 9.5 | 98 | 40 | 0.2 | ○ | ≧9 |
| Comparative example 2b | Not processed (twentieth sample) | 9.5 | 98 | 40 | 0.2 | x | ≦5 |

Example 2

Similarly to EXAMPLE 1, the ceramic multi-layer substrate having the shrink-prevention ceramic green sheets formed on both of the main surfaces was prepared. The first and second removing steps were performed under the conditions shown in Table 2.

Thereafter, in the third removing step, water, combined with compressed air in the range of about 147 kPa to about 539 kPa, was sprayed for about 120 seconds against the ceramic multi-layer substrate subjected to the first and second removing steps.

As a result of these steps, the ceramic multi-layer substrates of Samples Nos. 9 to 14 shown in Table 2 were prepared.

Comparative Example 3

A composite laminate was formed and fired under the same preparation conditions as those described in EXAMPLE 2. The shrink-prevention ceramic green sheets were removed from the composite laminate, while not being subjected to the second removing step. In particular, in the first removing step, water and compressed air with about 539 kPa were sprayed for about 120 seconds against the shrink-prevention ceramic green sheets provided on both of the main surfaces of the ceramic multi-layer substrate. Thereafter, in the third removing step, water and compressed air in the range of about 147 kPa to about 539 kPa were sprayed for about 120 seconds. As a result of the above-described steps, the ceramic multi-layer substrate of Third Comparative Example was produced.

Comparative Example 4

A composite laminate was formed and fired under the same conditions as those described in EXAMPLE 2. Thus, twenty samples were prepared. For these twenty samples which were not subjected to the first removing step, the second and third removing steps were performed to remove the shrink-prevention ceramic green sheets. In the second removing step, water and alumina powder with an average particle size of about 9.5 μm, together with compressed air at about 98 kPa, were sprayed for about 120 seconds against both of the main surfaces of the shrink-prevention ceramic green sheets provided on both of the main surfaces of the ceramic multi-layer substrate. Thereafter, in the third removing step, water, together with compressed air in the range of about 147 kPa to about 539 kPa, was sprayed for about 120 seconds against the twenty samples. For the twenty samples, the second and third removing steps were performed sequentially, one by one from the first sample to the twentieth sample. After these steps, a ceramic multi-layer substrate as comparative example 4a (first sample) and a ceramic multi-layer substrate as comparative example 4b (second sample) were prepared.

The appearance of the respective samples (samples Nos. 9 to 14, comparative example 3, and comparative examples 4a and 4b) prepared in EXAMPLE 2, COMPARATIVE EXAMPLE 3, and COMPARATIVE EXAMPLE 4, were examined, and the results were shown in Table 1, where a circular mark represents "no irregular-removal", and a cross mark does "irregular removal".

Thereafter, a palladium catalyst was applied to the respective samples of the ceramic multi-layer substrates, and then, the cleaning was performed, such that nuclei of the palladium catalyst were formed on the interdigital electrode portion. Thereafter, electroless nickel plating was performed. Thus, nickel plating was performed on the interdigital electrode portion. A voltage of about 50 V was applied to the interdigital electrode portion under the conditions of about 85° C. and about 85% RH for about 1000 hours. Then, the insulation resistance was measured. Table 2 shows the measuring results.

TABLE 2

| Sample Number | First removing step Pressure (kPa) | Second removing step | | Third removing step Pressure (kPa) | Appearance of substrate | Insulation resistance LogIR (Ω) |
| --- | --- | --- | --- | --- | --- | --- |
| | | Average particle size (μm) | Pressure (kPa) | | | |
| No. 9 | 147 | 9.5 | 98 | 147 | ○ | ≧9 |
| No. 10 | 539 | 9.5 | 98 | 147 | ○ | ≧9 |
| No. 11 | 147 | 9.5 | 343 | 147 | ○ | ≧9 |
| No. 12 | 147 | 40 | 98 | 147 | ○ | ≧9 |
| No. 13 | 147 | 40 | 343 | 147 | ○ | ≧9 |
| No. 14 | 147 | 9.5 | 98 | 539 | ○ | ≧9 |
| Comparative example 3 | 539 | Not processed | | 539 | x | ≦5 |
| Comparative example 4a | Not processed (first sample) | 9.5 | 98 | 539 | ○ | ≧9 |
| Comparative example 4b | Not processed (twentieth sample) | 9.5 | 98 | 539 | x | ≦5 |

As described above, in this example, the shrink-prevention ceramic green sheets were uniformly removed, and outstanding insulation resistance was maintained.

On the other hand, in the comparative example 1, irregular removal was clearly shown, and the insulation resistance represented by LogIR was not more than about 5.

In the comparative example 2, the first ceramic multi-layer substrate had no irregular removal, while that of the second ceramic multi-layer substrate had some irregular removal. Regarding the insulation resistance, the LogIR of the first ceramic multi-layer substrate was not less than about 9, while that of the twentieth ceramic multi-layer substrate was not more than about 5. That is, the repetition of the second removing step causes the removing capacity for the shrink-prevention ceramic green sheets to be greatly reduced.

In the comparative example 3, irregular removal as clearly shown, and the insulation resistance represented by LogIR was not more than about 5.

In the comparative example 4, the first ceramic multi-layer substrate had no irregular removal, while that of the twentieth ceramic multi-layer substrate had some irregular removal. Regarding the insulation resistance, the first ceramic multi-layer substrate had a LogIR of not less than about 9, while the twentieth ceramic multi-layer substrate has a LogIR of not more than about 5. That is, the repetition of the second removing step causes the removing capacity for the shrink-prevention ceramic green sheets to be greatly reduced.

Figure 5:
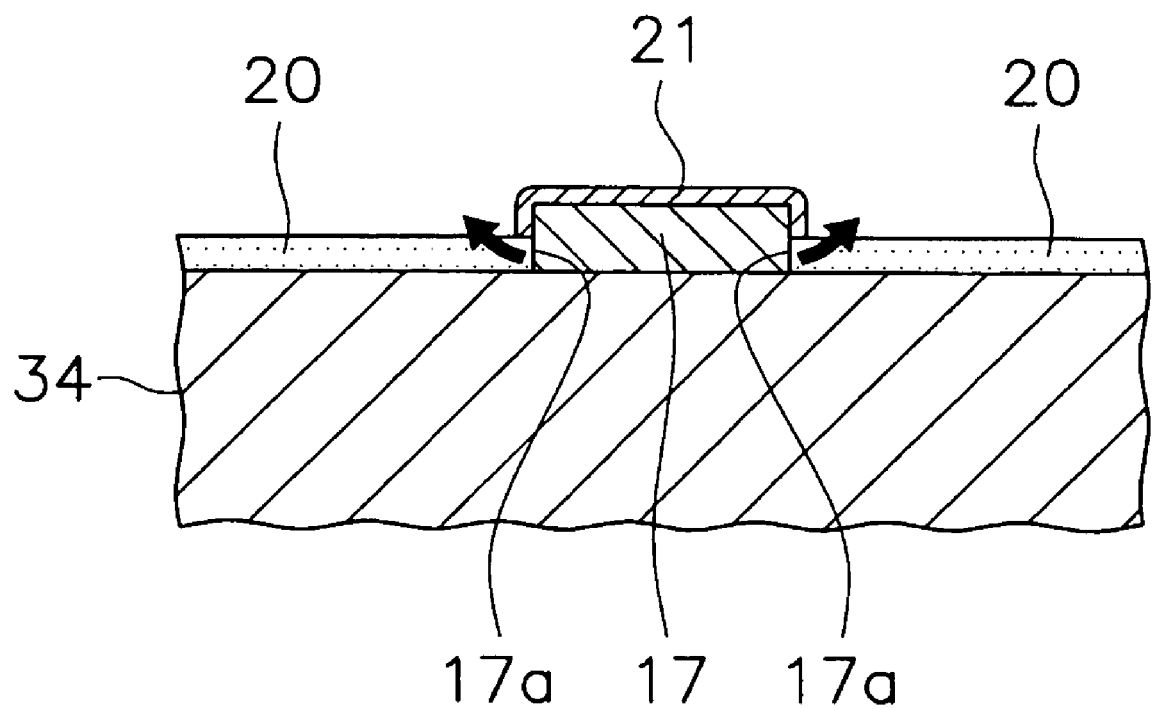
FIG. 5 is a schematic view showing the migration of an electrode on the ceramic multi-layer substrate.

The reason for the reduction in insulation resistance of the twentieth ceramic multi-layer substrates of the comparative examples 1 and 3 and the comparative examples 2 and 4 is described below. As shown in FIG. 5, a residual material 20 made of the shrink-prevention ceramic green sheets exists on surfaces of a ceramic multi-layer substrate 34. Thus, a portion of the end surfaces 17a of the electrode 17 of the interdigital electrode is covered with the residual material. The residual material 20 is porous. Thus, migration of Ag occurs in the portion where no plating is performed, in the direction shown by an arrow, such that the insulation resistance is reduced.

As described above, the method of producing a ceramic multi-layer substrate according to preferred embodiments of the present invention produces ceramic multi-layer substrates having a high dimensional accuracy can are produced with high efficiency.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

The invention claimed is:

1. A method of producing a ceramic multi-layer substrate comprising the steps of:
   preparing a composite laminate including an unfired ceramic laminate formed by laminating of a plurality of substrate ceramic green sheets, and a shrink-prevention ceramic green sheet arranged on at least one of the main surfaces of the unfired ceramic laminate, the shrink-prevention ceramic green sheet having a sintering temperature that is greater than the firing temperature of the unfired ceramic laminate;
   firing the composite laminate at a temperature at which the unfired ceramic laminate is fired and which is less than the sintering temperature of the shrink-prevention ceramic green sheet; and
   removing the shrink-prevention ceramic green sheet from the fired composite laminate; wherein
   the step of removing the shrink-prevention ceramic green sheet includes:
      a first removing step of spraying a liquid material and compressed gas against the shrink-prevention ceramic green sheet on the main surface of the composite laminate subjected to the firing step; and
      a second removing step of spraying ceramic powder, a liquid material, and compressed gas against the main surface of the ceramic multilayer after the first removing step.

2. The method of producing a ceramic multi-layer substrate according to claim 1, wherein the step of removing the shrink-prevention ceramic green sheet includes a third removing step of supersonic-cleaning the ceramic multilayer substrate after the first and second removing steps.

3. The method of producing a ceramic multi-layer substrate according to claim 1, wherein the step of removing the shrink-prevention ceramic green sheet further includes a third removing step of spraying a liquid material and compressed gas against the main surface of the ceramic multi-layer substrate after the first and second removing steps.

4. The method of producing a ceramic multi-layer substrate according to claim 1, wherein the pressure of the compressed gas in the first removing step is in the range of about 147 kPa to about 539 kPa.

5. The method of producing a ceramic multi-layer substrate according to claim 1, wherein the pressure of the compressed gas in the second removing step is in the range of about 98 kPa to about 343 kPa.

6. The method of producing a ceramic multi-layer substrate according to claim 1, wherein the average particle size of the ceramic powder in the second removing step is in the range of about 9.5 μm to about 40 μm.

7. The method of producing a ceramic multi-layer substrate according to claim 2, wherein in the third removing step, the ceramic multi-layer substrate is supersonic-cleaned under the conditions of a frequency of about 40 kHz to about 100 kHz and an output of about 0.2 W/cm$^2$ to about 2.0 W/cm$^2$.

8. The method of producing a ceramic multi-layer substrate according to claim 3, wherein the gas of the compressed air in the third removing step is in the range of about 147 kPa to about 539 kPa.

9. The method of producing a ceramic multi-layer substrate according to claim 1, wherein the composite laminate includes at least one conductive layer disposed between respective ones of the plurality of substrate ceramic green sheets.

10. The method of producing a ceramic multi-layer substrate according to claim 1, wherein the compressed gas in the first removing step is compressed air.

11. The method of producing a ceramic multi-layer substrate according to claim 1, wherein the liquid material in the first removing step is water.

12. The method of producing a ceramic multi-layer substrate according to claim 1, wherein the compressed gas in the second removing step is compressed air.

13. The method of producing a ceramic multi-layer substrate according to claim 1, wherein the liquid material in the second removing step is water.

14. The method of producing a ceramic multi-layer substrate according to claim 2, wherein in the third removing step, the composite laminate is set in a cleaning basket so as to stand upright.

15. The method of producing a ceramic multi-layer substrate according to claim 14, wherein in the third removing step, supersonic waves are irradiated into a cleaning liquid disposed on the cleaning basket by a supersonic wave vibrator.

16. The method of producing a ceramic multi-layer substrate according to claim 15, wherein the cleaning liquid is one of a methylene chloride aqueous solution and a trichloroethylene aqueous solution.

17. The method of producing a ceramic multi-layer substrate according to claim 3, wherein the liquid material in the third removing step is water.

18. The method of producing a ceramic multi-layer substrate according to claim 3, wherein the compressed gas in the third removing step is compressed air.

19. The method of producing a ceramic multi-layer substrate according to claim 1, wherein the pressure in the second removing step is less than the pressure in the first removing step.

* * * * *